United States Patent
Raj et al.

(10) Patent No.: US 7,031,680 B2
(45) Date of Patent: Apr. 18, 2006

(54) STOP-ON-STATION METHOD AND APPARATUS

(75) Inventors: Raghu G. Raj, Austin, TX (US); Junsong Li, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 537 days.

(21) Appl. No.: 10/310,446

(22) Filed: Dec. 5, 2002

(65) Prior Publication Data

US 2004/0110478 A1 Jun. 10, 2004

(51) Int. Cl.
*H04B 1/18* (2006.01)

(52) U.S. Cl. .................. 455/161.3; 455/184.1

(58) Field of Classification Search ............. 455/161.1, 455/161.2, 161.3, 184.1, 186.1, 226.1, 226.2, 455/226.3, 226.4
See application file for complete search history.

(56) References Cited

U.S. PATENT DOCUMENTS

| | | | | |
|---|---|---|---|---|
| 4,580,287 A | * | 4/1986 | Richards, Jr. ............ | 455/226.2 |
| 4,704,734 A | * | 11/1987 | Menich et al. ............... | 455/440 |
| 5,073,975 A | | 12/1991 | Zarabadi et al. ............ | 455/161 |
| 5,073,976 A | * | 12/1991 | Kennedy ................... | 455/161.3 |
| 5,125,105 A | * | 6/1992 | Kennedy et al. .......... | 455/164.1 |
| 5,493,711 A | * | 2/1996 | Koyama ................... | 455/194.1 |
| 5,555,451 A | * | 9/1996 | Kennedy et al. ......... | 455/161.2 |
| 5,603,087 A | * | 2/1997 | Shultz ........................ | 455/423 |
| 5,887,028 A | * | 3/1999 | Araki .......................... | 375/224 |
| 6,389,270 B1 | | 5/2002 | Nohrden et al. ......... | 455/161.1 |
| 6,493,544 B1 | * | 12/2002 | Baxley et al. ............ | 455/161.1 |
| 2002/0142746 A1 | | 10/2002 | Li et al. ..................... | 455/307 |

* cited by examiner

*Primary Examiner*—Nguyen T. Vo
(74) *Attorney, Agent, or Firm*—Fulbright & Jaworski LLP

(57) ABSTRACT

A method for stopping on a radio station includes calculating a radio signal quality (205) using a multipath echo indicator and determining if the radio signal quality is greater than a predetermined signal quality threshold (210). A zero crossings indicator of a demodulated signal may be used (225) to reduce a false alarm rate. An apparatus includes an antenna (105), a local oscillator (110) coupled to the antenna, an analog-to-digital converter circuit (115) coupled to the local oscillator, a demodulator circuit (120) coupled to the analog-to-digital converter circuit, a signal strength determining circuit (125) coupled to the analog-to-digital converter circuit, a logarithmic circuit (150) coupled to the signal strength determining circuit, a multipath echo bandpass filter (155) coupled to the logarithmic circuit, and a stop-on-station circuit (145) coupled to the demodulator circuit, the multipath echo bandpass filter, and the logarithmic circuit.

16 Claims, 3 Drawing Sheets

STOP-ON-STATION METHOD AND APPARATUS

BACKGROUND OF THE INVENTION

1. Field of the Invention

The invention relates generally to the field of communications. More particularly, the invention relates to the detection of radio stations.

2. Discussion of the Related Art

Radio stations broadcast information encoded into radiofrequency (RF) signals on a plurality of transmission schemes. These RF signals may be, for example, amplitude modulated (AM) signals or frequency modulated (FM) signals. Typically, the transmitted information is decoded into an audio signal at a radio receiver.

Modern radio receivers include seek and scan functions. These functions are initiated by a user and attempt to search for a station that meets certain criteria. A seek function searches through radio channels and stops when the receiver finds the next station. A scan function also searches though radio channels and stops at the next station, but only for a limited period of time, repeating the process until terminated by the user.

Usually, in order for seek and scan functions to find and stop at radio stations, the quality of the received RF signal is measured. A typical technique includes determining if the signal strength is greater than a predetermined magnitude. Another metric used for signal quality measurement is ultrasonic noise (USN). A problem with these metrics is that they do not satisfactorily meet the requirements for finding suitable radio stations. Moreover, even when a good quality signal is found, the encoded information may be other than an audio signal (false alarm).

Thus, there is a need for a method and/or apparatus for utilizing metrics that can satisfactorily characterize the quality of received RF signals. Further, there is a need for minimizing false alarm rates.

SUMMARY OF THE INVENTION

There is a need for the following embodiments. Of course, the invention is not limited to these embodiments.

According to an aspect of the invention, a method for stopping on a radio station includes calculating a radio signal quality using a multipath echo indicator, and stopping at the radio station if the radio signal quality is greater than a predetermined signal quality threshold.

According to another aspect of the invention, a method for stopping on a radio station includes demodulating a radio signal to produce a demodulated radio signal, calculating a zero crossings indicator of the demodulated radio signal, and stopping at the radio station if the zero crossings indicator is less than a predetermined zero crossings threshold.

According to yet another aspect of the invention, an apparatus for stopping on a radio station includes an antenna for receiving an RF signal having a plurality of radio stations, a local oscillator coupled to the antenna, an analog-to-digital converter circuit coupled to the local oscillator, a demodulator circuit coupled to the analog-to-digital converter circuit for producing a demodulated radio signal, a signal strength determining circuit coupled to the analog-to-digital converter circuit for producing a mean signal strength quantity, a logarithmic circuit coupled to the signal strength determining circuit, for producing a signal strength indicator, a multipath echo bandpass filter coupled to the logarithmic circuit for producing a multipath echo indicator, and a stop-on-station circuit coupled to the demodulator circuit and to the multipath echo bandpass filter for stopping on a radio station as a function of the signal strength indicator, the multipath echo indicator, and a zero crossings indicator of the demodulated radio signal.

These, and other, aspects and embodiments of the invention will be better appreciated and understood when considered in conjunction with the following description and the accompanying drawings. It should be understood, however, that the following description, while indicating various embodiments of the invention and numerous specific details thereof, is given by way of illustration and not of limitation. Many substitutions, modifications, additions and/or rearrangements may be made within the scope of the invention without departing from the spirit thereof, and the invention includes all such substitutions, modifications, additions and/or rearrangements.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore nonlimiting, embodiments illustrated in the drawings, wherein like reference numerals (if they occur in more than one view) designate the same or similar elements. The invention may be better understood by reference to one or more of these drawings in combination with the description presented herein. It should be noted that the features illustrated in the drawings are not necessarily drawn to scale.

DETAILED DESCRIPTION

The invention and the various features and advantageous details thereof are explained more fully with reference to the nonlimiting embodiments that are illustrated in the accompanying drawings and detailed in the following description. It should be understood that the detailed description and the specific examples, while indicating specific embodiments of the invention, are given by way of illustration only and not by way of limitation. Various substitutions, modifications, additions and/or rearrangements within the spirit and/or scope of the underlying inventive concept will become apparent to those of ordinary skill in the art from this disclosure.

Exemplary embodiments of the invention include a method and/or apparatus for detecting modulated radio frequency signals, for example, FM and AM radio stations in a fixed or mobile radio environment while minimizing false alarm rates. The false alarm rate is defined herein as the rate at which the receiver stops at an unsuitable radio station during a seek, scan, or searching operation.

In one exemplary embodiment, the invention includes a multipath echo indicator to determine the quality of the radio signal and improve detection. Other embodiments of the invention may also include an adjacent station indicator to further improve detection of the radio signal by eliminating stations with high levels of interference. Additional embodiments of the invention may also include an ultrasonic noise indicator in conjunction with the multipath echo measurement and/or the adjacent station indicator to improve detection of the radio signal.

In another exemplary embodiment, the invention may include using a zero crossing (ZC) indicator of the demodulated radio signal to decrease or minimize the false alarm rate. In yet another embodiment, the invention may include using a combination of multipath echo, adjacent station, ultrasonic noise, and zero crossing indicators to perform a seek, scan, or search operation.

Figure 1:
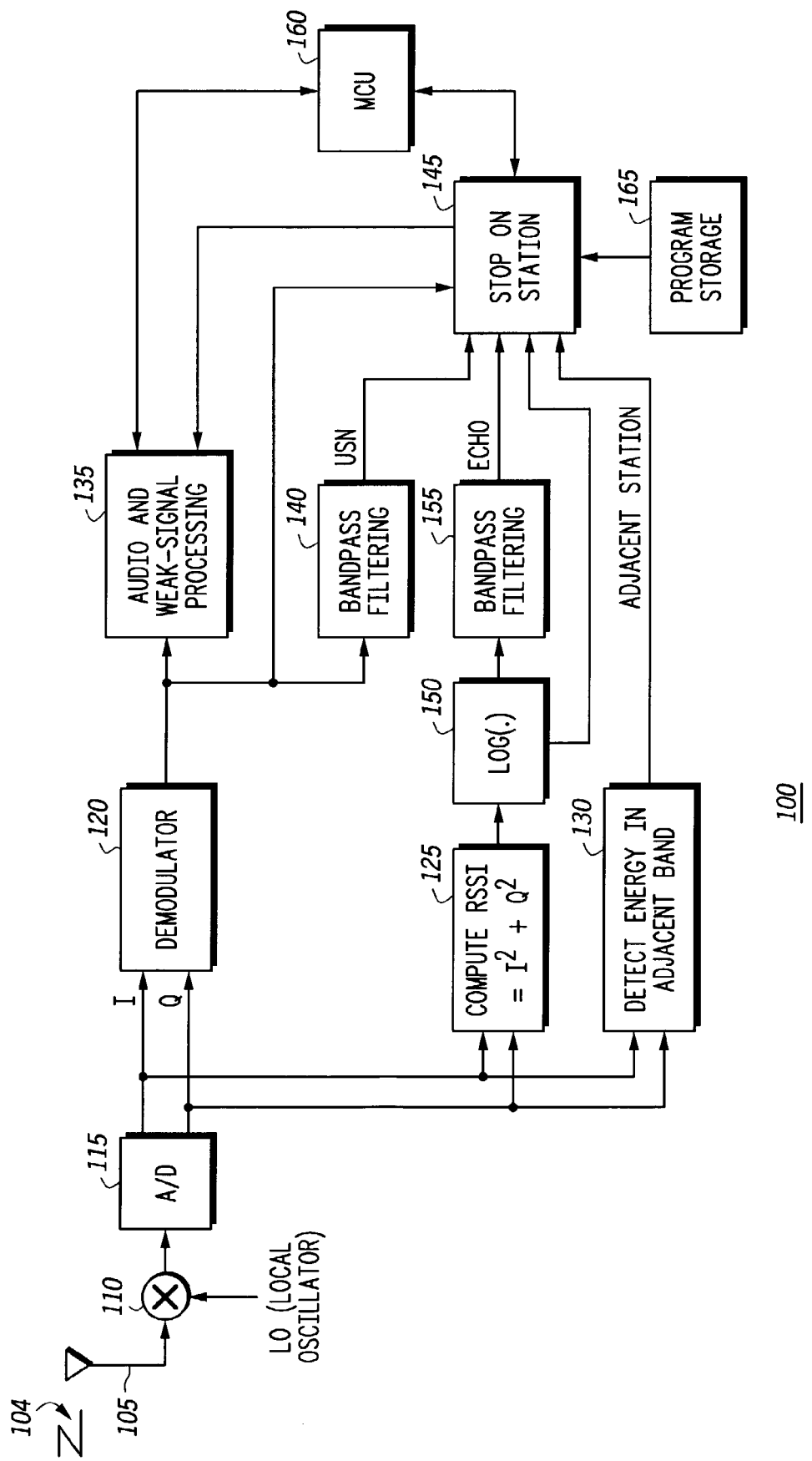
FIG. 1 is a block diagram of a radio frequency stop-on-station apparatus, representing an embodiment of the invention.

Referring to FIG. 1, a block diagram of a radio frequency stop-on-station circuit 100 is depicted according to an exemplary embodiment of the invention. A radio signal 104 is received by an antenna 105 and mixed with a local oscillator signal at a mixer 110. Radio signal 104 may be, for example, a frequency modulated (FM) or amplitude modulated (AM) signal, or any other type of radio frequency modulated signal. The output of the mixer 110 is coupled to an analog-to-digital converter circuit 115. The analog-to-digital converter circuit 115 is coupled to a demodulator 120, a signal strength determining circuit 125, and an adjacent band energy detector circuit 130. The demodulator 120 is coupled to an audio and weak-signal processing circuit 135, a stop-on-station circuit 145, and an ultrasonic noise bandpass filter 140.

The signal strength determining circuit 125 is coupled to a logarithmic circuit 150, and the logarithmic circuit 150 is coupled to a multipath echo bandpass filter 155. The audio and weak-signal processing circuit 135, the ultrasonic noise bandpass filter 140, the logarithmic circuit 150, the multipath echo bandpass filter 155, the adjacent band energy detector circuit 130, and a program storage device 165 are all coupled to the stop-on-station circuit 145. A microcontroller unit 160 is coupled to the audio and weak-signal processing circuit 135 and to the stop-on-station circuit 145.

The analog-to-digital converter circuit 115 outputs in-phase (I) and quadrature phase (Q) digital signals to the demodulator circuit 120, the signal strength determining circuit 125, and the adjacent band energy detector circuit 130. The demodulator circuit 120 may be, for example, an FM or an AM demodulator circuit, or any other appropriate demodulator depending upon the particular modulation scheme of radio signal 104. The demodulator circuit 120 outputs a multiplexed signal to the audio and weak-signal processing circuit 135, the stop-on-station circuit 145, and the ultrasonic noise bandpass filter 140. The signal strength determining circuit 125 outputs a sum of the squares of the in-phase and quadrature phase signals (a signal strength quantity) from the analog-to-digital converter circuit 115 (Received Signal Strength Indication or RSSI) to the logarithmic circuit 150. The output of the logarithmic circuit 150 is the logarithm of the mean signal strength, i.e.: Log(RSSI).

The stop-on-station circuit 145 receives the signal strength indicator (Log(RSSI)) from the logarithmic circuit 150, an ultrasonic noise indicator from the ultrasonic noise bandpass filter 140, a multipath echo indicator from the multipath echo bandpass filter 155, and an adjacent station indicator from the adjacent band energy detector circuit 130. As explained below in more detail with reference to flowcharts of FIGS. 2 and 3, one or more of these indicators may be used by the stop-on-station circuit 145 to calculate the radio signal quality.

The ultrasonic noise indicator may be defined as the noise in the demodulated signal that is beyond the audible frequency range. This flag is typically obtained by filtering the demodulator signal (with cutoff frequency that is well above the audible frequency range of 20 KHz). Ideally, the energy of the signal in this non-audible frequency range should be small (since information is not typically transmitted in this band) and so any deviation from this is typically used as a rough indicator of the amount distortion in the system.

The multipath echo indicator may be defined as a measure of the amount of multipath interference in the radio channel. In one embodiment, this is estimated by band-pass filtering the log(RSSI) signal. For an ideal FM signal the non-dc frequency components of the RSSI may be close to zero (since an FM signal has constant modulus) and so band-pass filtering signal gives a measure of deviation from this ideal case which is due primarily to the multipath interference in the channel. Thus, this particular flag is specific to FM systems whereas the other flags can be used for AM and FM systems.

The adjacent station indicator may be defined as a measure of the amount of interference due to the adjacent stations. This quantity is determined by estimating the relative amount of energy in the higher sub-bands of the pre-demodulated signal with respect to the desired signal energy level (of the pre-demodulated signal). In one exemplary embodiment, the adjacent channel indicator may include an IF (intermediate frequency) filter for dynamically adjusting an intermediate frequency. The IF filter may include a filter bank, a set of power/amplitude estimator circuits, and a filter control. In operation, the filter bank may generate sub-bands, each sub-band having a predetermined frequency range. The set of power/amplitude estimators may provide an estimated power/amplitude in each sub-band, and a filter control may use the power/amplitude estimates to determine the relative energies of each sub-band signal, thereby determining the adjacent channel indicator.

Still referring to FIG. 1, the stop-on-station circuit 145 receives the multiplexed signal from the demodulator circuit 120 and calculates the rate of zero crossings of the demodulated audio signal. In one embodiment, the stop-on-station circuit 145 calculates an average number of zero crossings, or a zero crossings indicator. The zero crossings indicator may be defined as the rate of zero-crossings in a signal. For well defined stochastic processes there may be explicit formulas for estimating the zero-crossing rate. For example, for Gaussian processes the zero-crossings rate may explicitly be computed in terms of the second-order statistics of the process. However, for empirically obtained signals, the zero crossing rate may be empirically estimated. In one embodiment, the zero-crossings rate is used as the average number of zero-crossings in an interval of time. In another embodiment, this interval of time (or window size of the observation) is programmable.

The microcontroller unit 160 controls the operation of the audio and weak-signal processing circuit 135 and of the stop-on-station circuit 145. The microcontroller unit 160 may also control a user interface or panel (not shown). The stop-on-station circuit 145 may send information such as calculated indicators to the audio and weak-signal processing circuit 135. The program storage media or device 165 may provide the stop-on-station 145 with instructions for performing a stop-on-station function, which may be included in a seek, scan, or search program.

In practice, the stop-on-station circuit 145 may be a programmable circuit, such as, for example, a microprocessor or digital signal processor-based (DSP) circuit, that operates in accordance with instructions stored in the program storage media 165. The program storage media 165 may be any type of readable memory including, for example, a magnetic or optical media such as a card, tape or disk, or a semiconductor memory such as a PROM or FLASH memory. The stop-on-station circuit 145 may be implemented in software, such as, for example, a software defined radio algorithm, or the functions may be implemented by a hardware circuit, or by a combination of hardware and software.

Figure 2:
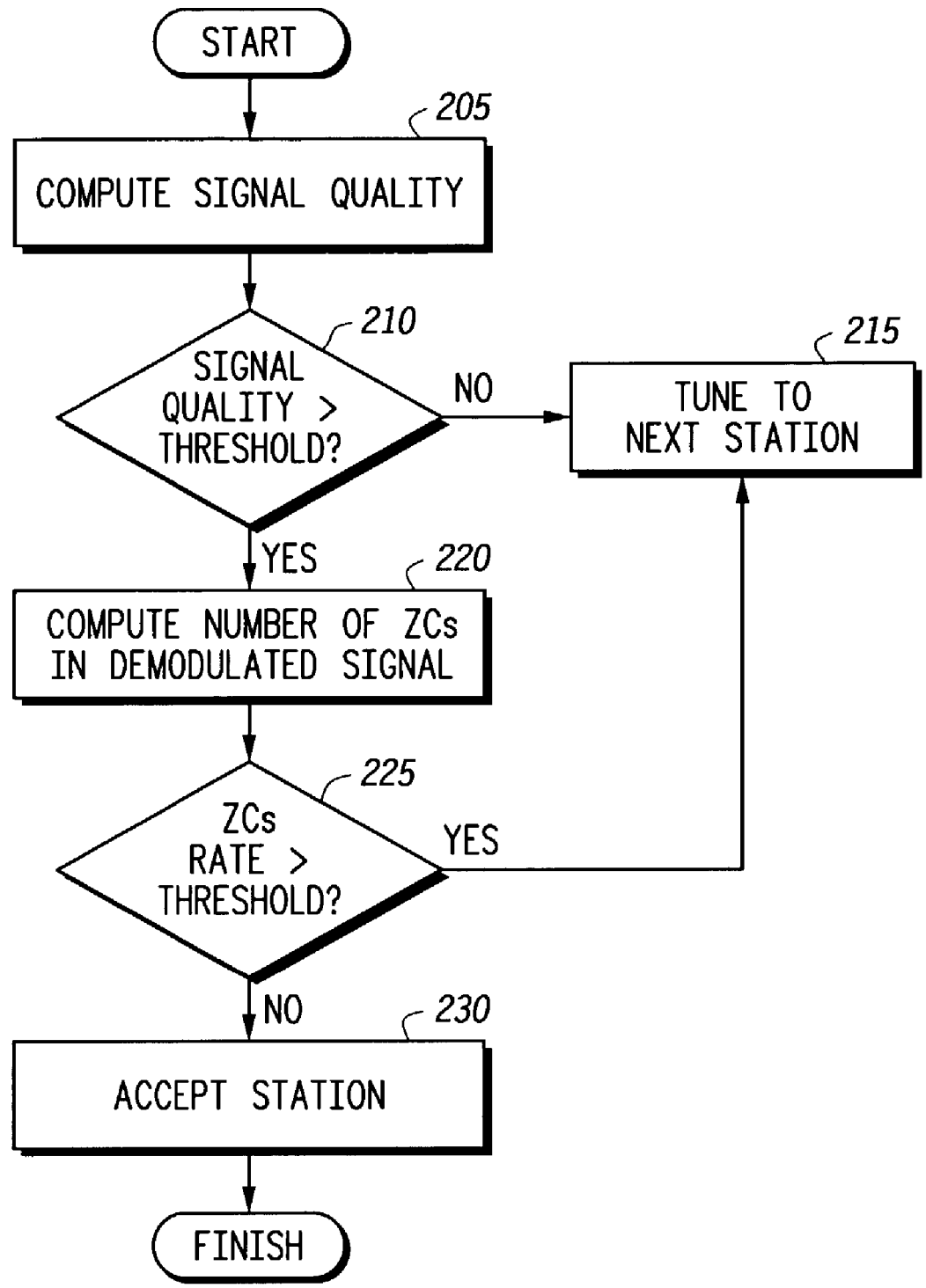
FIG. 2 is a flowchart of a radio frequency stop-on-station method, representing an embodiment of the invention.
Figure 3:
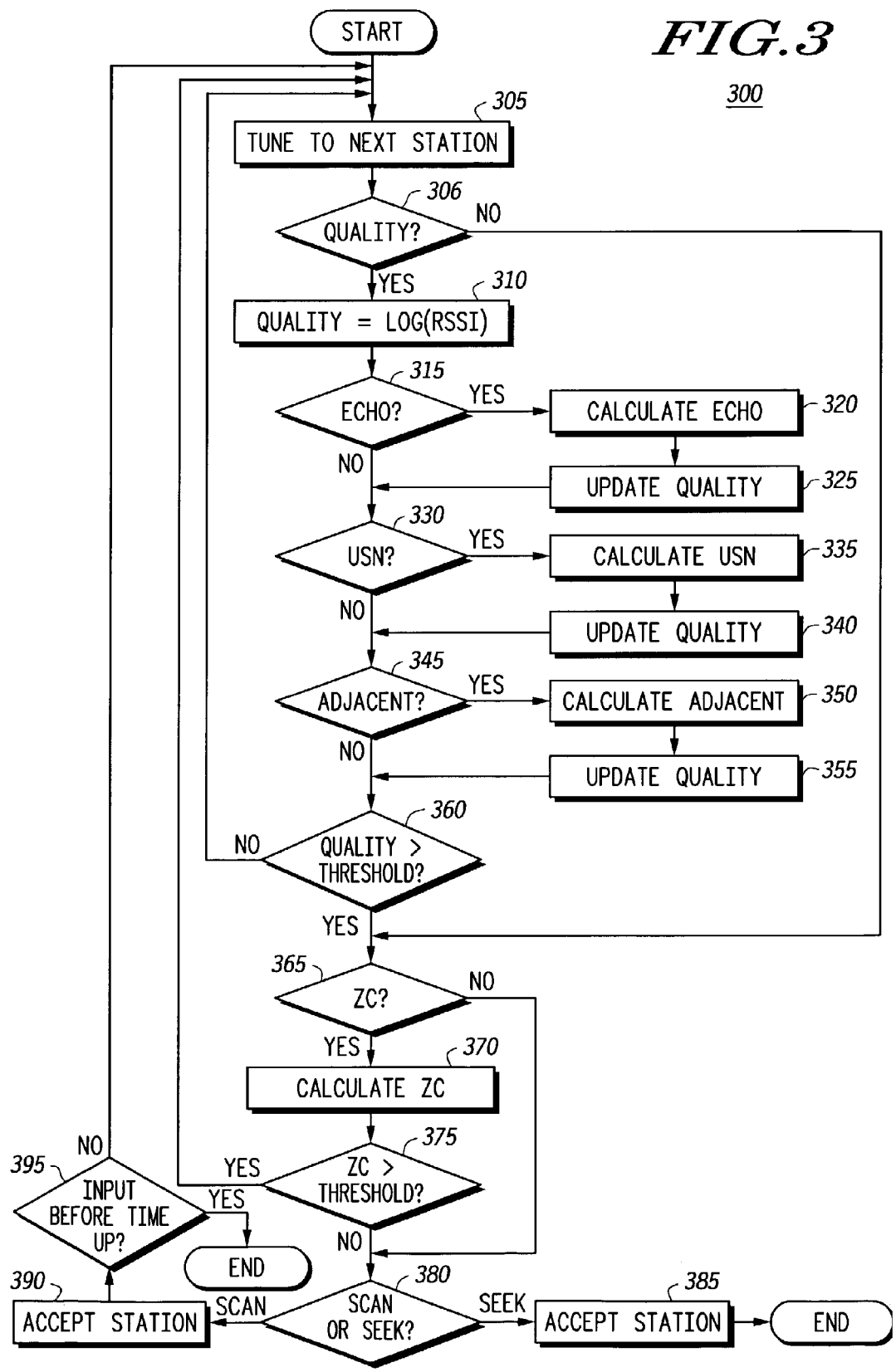
FIG. 3 is a flowchart of a seek/scan method, representing an embodiment of the invention.

When the stop-on-station circuit 145 is a programmable circuit, a program, such as that presented below and discussed in detail with reference to FIGS. 2 and 3 is stored in the program storage media 165 to create an apparatus in accordance with an embodiment of the present invention that operates in accordance with embodiments of the methods of the present invention. In the alternative, the stop-on-station circuit 145 may be hard-wired or may use predetermined data tables, or may be a combination of hard-wired and programmable circuitry.

Referring to FIG. 2, a flowchart of a radio frequency stop-on-station method 200 is depicted according to an exemplary embodiment of the invention. The stop on station algorithm 200 may be performed by the stop-on-station circuit 145 detailed in FIG. 1.

Upon initiation of the algorithm 200, the signal quality is computed in step 205 using an equation such as, for example:

$$\text{quality} = \text{Log}(RSSI)$$

where: quality is the radio signal quality; and
Log(RSSI) is the logarithm of the radio signal strength.

In another exemplary embodiment, the signal quality may be computed in step 205 using another equation such as, for example:

$$\text{quality} = \text{Log}(RSSI) - f(\text{echo}/RSSI)$$

where: quality is the radio signal quality;
Log(RSSI) is the logarithm of the radio signal strength; and
f(echo/RSSI) is the multipath echo indicator.

In another exemplary embodiment, the signal quality may be computed in step 205 using another equation such as, for example:

$$\text{quality} = \text{Log}(RSSI) - [f(\text{echo}/RSSI) + g(\text{adjacent station})]$$

where: quality is the radio signal quality;
Log(RSSI) is the logarithm of the radio signal strength indicator;
f(echo/RSSI) is the multipath echo indicator; and
g(adjacent station) is the adjacent channel (or station) indicator.

In yet another exemplary embodiment, the signal quality may be computed in step 205 using another equation such as, for example:

$$\text{quality} = \text{Log}(RSSI) - [f(\text{echo}/RSSI) + g(\text{adjacent station}) + h(usn)]$$

where: quality is the radio signal quality;
Log(RSSI) is the logarithm of the radio signal strength indicator;
f(echo/RSSI) is the multipath echo indicator;
g(adjacent station) is the adjacent channel (or station) indicator; and
h(usn) is the ultrasonic noise indicator.

Other methods may also be acceptable for determining the signal quality. Next, the calculated signal quality is compared to a predetermined signal quality threshold in step 210. If the signal quality is greater than the signal quality threshold, step 220 calculates an average of zero crossings (zero crossings indicator) of the demodulated signal, otherwise the algorithm moves on to the next station in step 215. The average number of zero crossings is compared to a predetermined zero crossings threshold in step 225. If the average number of zero crossings of the demodulated signal is greater than the zero crossings threshold, the algorithm tunes to the next station in step 215, otherwise the current station is accepted in step 230.

One exemplary embodiment includes using the stop-on-station method detailed in FIG. 2 to perform a seek and/or a scan operation. When initiated by a user, the seek and/or scan operation sweeps through radio channels and stops when the receiver finds the suitable next station.

Referring to FIG. 3, a flowchart of a seek/scan algorithm 300 is depicted according to another embodiment of the invention. The seek/scan method 300 may be performed by the stop-on-station circuit 145 detailed in FIG. 1.

Upon initiation of the method 300, a new station is tuned to in step 305. Next, if a signal quality metric is to be used, as determined in step 306, control passes to step 310. Otherwise control passes to step 365. In step 310, a signal quality is calculated as Log(RSSI). Next, if a multipath echo metric will be used as determined by the algorithm in step 315, the multipath echo indicator is calculated in step 320 and subtracted from the signal quality in step 325. Otherwise control passes to step 330. Next, if an ultrasonic noise metric will be used as determined by step 330, the ultrasonic noise indicator is calculated in step 335 and subtracted from the signal quality in step 340. Otherwise control passes to step 345. Next, if an adjacent station metric will be used as determined by the algorithm in step 345, the adjacent station indicator is calculated in step 350 and subtracted from the signal quality in step 355. Otherwise control passes to step 360.

The signal quality is compared to a signal quality threshold in step 360. If the signal quality exceeds the signal quality threshold, control passes to step 365. Otherwise control is returned to step 305 and the next station is tuned. Next, if a zero crossings metric will be used as determined by step 365, a zero crossings indicator is calculated in step 370 and compared to a zero crossings threshold in step 375. If the zero crossings indicator exceeds the zero crossings threshold, control is returned to step 305 and the next station is tuned. If a zero crossings metric will not be used as determined by the algorithm in step 365, or if the zero crossings indicator does not exceed the zero crossings threshold as determined by step 375, control passes to step 380.

The method 300 determines whether it is performing a seek or a scan operation in step 380. If a seek operation is being performed, the current station is accepted in step 385 and the method ends. If a scan operation is being performed, the current station is accepted in step 390 and control is passed to step 395. In step 395, if a user performs an input operation before a scan timer runs out, the method ends. Otherwise control is passed to step 305 and the method tunes to the next station.

One embodiment may include verifying if a Program Identification (PI) code is valid, as defined by Radio Data System (RDS) standards. A PI code verification step may be used in conjunction with the methods described above for deciding whether or not to stop at a radio station. This embodiment may use a radio signal quality criteria, a demodulated audio signal zero crossings criteria, and/or a PI code verification criteria for stopping at a radio station.

Embodiments of he invention may be implemented, for example, in a digital signal processor or in a digital intermediate frequency (DIF) radio hardware. Other embodiments of the invention may also be implemented in a software radio or a combination of DIF hardware and software radio.

The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically. The term computer program, program, or software, as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system.

The appended claims are not to be interpreted as including means-plus-function limitations, unless such a limitation is explicitly recited in a given claim using the phrase(s) "means for" and/or "step for." Subgeneric embodiments of the invention are delineated by the appended independent claims and their equivalents. Specific embodiments of the invention are differentiated by the appended dependent claims and their equivalents.

What is claimed is:

1. A method for stopping on a radio station, comprising:
   receiving a radio signal;
   determining a mean radio signal strength quantity;
   determining a logarithmic function of a radio signal strength indicator using the mean radio signal strength quantity;
   bandpass filtering the logarithmic function of the signal strength indicator to produce a multipath echo indicator;
   determining a radio signal quality;
   demodulating the radio signal to produce a demodulated radio signal;
   determining a zero crossings indicator of the demodulated radio signal if the radio signal quality is less than a signal quality threshold; and
   stopping at the radio station based on the radio signal quality, where the radio signal quality is a function of the signal strength indicator, the multipath echo indicator, and the zero crossings indicator.

2. The method of claim 1, the step of determining the radio signal quality comprising determining the radio signal quality using an ultrasonic noise indicator.

3. The method of claim 2, further comprising subtracting the multipath echo indicator and the ultrasonic noise indicator from the logarithmic function of the mean radio signal strength.

4. The method of claim 1, wherein determining the radio signal strength includes subtracting the multipath echo indicator from the logarithmic function of the mean radio signal strength.

5. The method of claim 1, wherein determining the radio signal quality comprises using an adjacent station indicator.

6. The method of claim 5, wherein determining the radio signal strength includes subtracting the multipath echo indicator and the adjacent station indicator from the logarithmic function of the mean radio signal strength.

7. The method of claim 1, wherein determining a zero crossings indicator includes determining a rate of zero crossings occurrences.

8. The method of claim 7, wherein determining a number of zero crossings occurrences includes determining an average number of zero crossings occurrences.

9. The method of claim 1, further comprising verifying if a program identification code is valid.

10. A program storage device, readable by a machine and tangibly embodying a representation of a program of instructions adapted to be executed by said machine to perform the method of claim 1.

11. An apparatus for stopping on a radio station, comprising:
    an antenna for receiving an RF signal having a plurality of radio stations;
    a local oscillator coupled to the antenna;
    an analog-to-digital converter circuit coupled to the local oscillator;
    a demodulator circuit coupled to the analog-to-digital converter circuit for producing a demodulated radio signal;
    a signal strength determining circuit coupled to the analog-to-digital converter circuit for producing a mean signal strength quantity;
    a logarithmic circuit coupled to the signal strength determining circuit, for producing a signal strength indicator;
    a multipath echo bandpass filter coupled to the logarithmic circuit, for producing a multipath echo indicator; and
    a stop-on-station circuit coupled to the demodulator circuit and to the multipath echo bandpass filter for stopping on a radio station as a function of the signal strength indicator, the multipath echo indicator, and a zero crossings indicator of the demodulated radio signal.

12. The apparatus of claim 11, further comprising an ultrasonic noise filter coupled to the demodulator circuit for producing an ultrasonic noise indicator, the stop-on-station circuit being coupled to the ultrasonic noise filter for stopping on a radio station as a function of the ultrasonic noise indicator.

13. The apparatus of claim 11, further comprising an adjacent band energy detector circuit coupled to the analog-to-digital converter circuit for producing an adjacent band indicator, the stop-on-station circuit being coupled to the adjacent band energy detector circuit for stopping on a radio station as a function of the adjacent band indicator.

14. The apparatus of claim 11, further comprising a program storage device coupled to the stop-on-station circuit.

15. The apparatus of claim 11, further comprising an audio and weak signal processing circuit coupled to the demodulator and to the stop-on-station circuit, for processing an audio signal.

16. The apparatus of claim 11, further comprising a microcontroller unit coupled to the stop-on-station circuit.

* * * * *